US008269829B2

(12) United States Patent
Miller et al.

(10) Patent No.: US 8,269,829 B2
(45) Date of Patent: Sep. 18, 2012

(54) IMAGER ASSEMBLY FOR REMOTE INSPECTION DEVICE

(75) Inventors: Jeffrey J. Miller, Northville, MI (US); Al Boehnlein, Ypsilanti, MI (US); Tye Newman, Howell, MI (US); Paul J. Eckhoff, Fenton, MO (US); Brandon Watt, Hartland, MI (US)

(73) Assignee: Perceptron, Inc., Plymouth, MI (US)

( * ) Notice: Subject to any disclaimer, the term of this patent is extended or adjusted under 35 U.S.C. 154(b) by 1296 days.

(21) Appl. No.: 11/968,449

(22) Filed: Jan. 2, 2008

(65) Prior Publication Data
US 2009/0167851 A1    Jul. 2, 2009

(51) Int. Cl.
*H04N 3/36* (2006.01)

(52) U.S. Cl. ............. 348/82; 348/65; 439/210; 600/110

(58) Field of Classification Search .................... 348/82, 348/65; 174/146; 439/210; 600/110
See application file for complete search history.

(56) References Cited

U.S. PATENT DOCUMENTS

| 7,289,139 | B2 * | 10/2007 | Amling et al. | 348/65 |
| 2006/0237221 | A1 * | 10/2006 | Glew | 174/146 |
| 2007/0117437 | A1 * | 5/2007 | Boehnlein et al. | 439/210 |
| 2007/0185379 | A1 * | 8/2007 | Newman et al. | 600/110 |

* cited by examiner

*Primary Examiner* — Tammy Nguyen
(74) *Attorney, Agent, or Firm* — Harness, Dickey & Pierce, P.L.C.

(57) ABSTRACT

An imager assembly for a remote inspection device includes an imager body. A circuit board retainer is slidably received through an end of the imager body. The circuit board retainer has deflectable legs separated by a slot. A circuit board assembly has an imager device connected to a first circuit board. A second circuit board is electrically connected to the first circuit board. The second circuit board is received in the slot of the circuit board retainer and frictionally engaged by the deflectable legs. A flexible tube has a first end connected to an end of the imager body using a first ferrule. A male connector is connected to a second end of the flexible tube using a second ferrule. A wiring harness is disposed through a bore of the flexible tube.

31 Claims, 21 Drawing Sheets

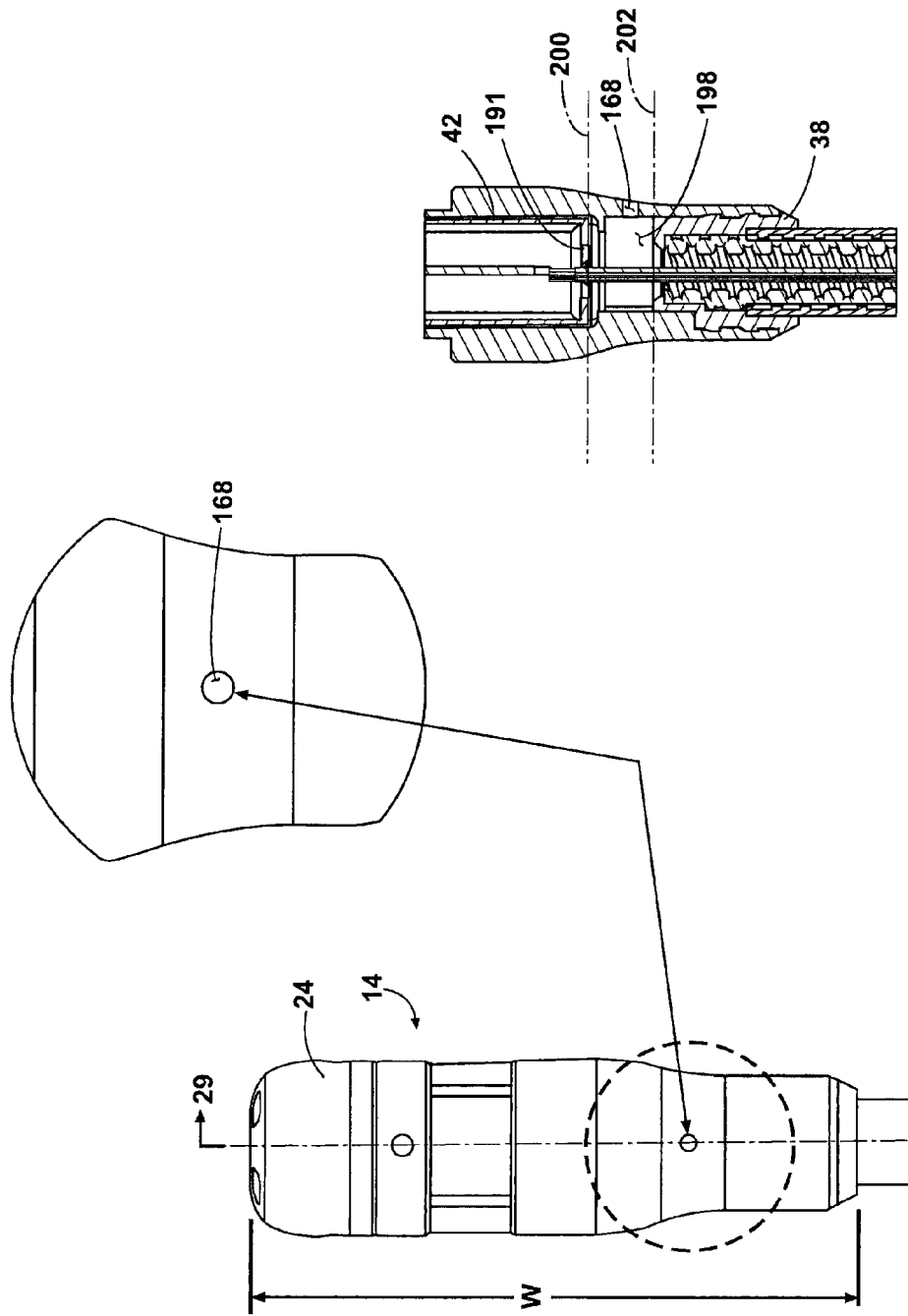

IMAGER ASSEMBLY FOR REMOTE INSPECTION DEVICE

FIELD

The present disclosure relates to borescopes and video scopes.

BACKGROUND

The statements in this section merely provide background information related to the present disclosure and may not constitute prior art.

Borescopes and video scopes used for inspecting visually obscure locations, hereinafter referred to as remote inspection devices, are typically tailored for particular applications. For instance, some remote inspection devices have been tailored for use by plumbers to inspect pipes and drains. Likewise, other types of remote inspection devices have been tailored for use by mechanics to inspect interior compartments of machinery being repaired.

Analog remote inspection devices are known which have hand-held control units using a power source such as a plurality of batteries, with data leads and power lines extending through a flexible cable to an image receiving head. Such devices commonly provide a remote light source to illuminate the area of interest and an imaging device to capture the illuminated image. Images provided by analog signal devices are adequate for many applications, however, where fine image detail is desired analog signal devices cannot convey enough data to improve the resolution. An increased power light source can also be used, however, increasing light source power detrimentally locally increases the heat generated which complicates the imaging device configuration.

SUMMARY

According to several embodiments of an improved imager head for an inspection device of the present disclosure, an imager assembly for a remote inspection device includes an imager body. A circuit board retainer is slidably received through an end of the imager body. The circuit board retainer has deflectable legs separated by a slot. A circuit board assembly has an imager device connected to a first circuit board. A second circuit board is electrically connected to the first circuit board. The second circuit board is received in the slot of the circuit board retainer and frictionally engaged by the deflectable legs.

According to other embodiments, an imager assembly for a remote inspection device includes an imager body and a circuit board assembly positioned in the imager body. A flexible tube has a first end connected to an end of the imager body using a first ferrule. A male connector is connected to a second end of the flexible tube using a second ferrule. A wiring harness is disposed through a bore of the flexible tube and electrically connected to the circuit board assembly. The wiring harness includes a plurality of wires joined in a side-by-side configuration and two individual wires twisted together to define a twisted wire pair.

According to other embodiments, an imager assembly for a remote inspection device includes an imager body and a circuit board assembly positioned in the imager body. The circuit board assembly includes an imager device connected to a first circuit board and a second circuit board electrically connected to the first circuit board. A flexible tube has a first end connected to an end of the imager body using a first ferrule. A third circuit board of the circuit board assembly is also provided. The first circuit board is connected to the second circuit board by a first flexible cable, and the second circuit board is connected to the third circuit board by a second flexible cable.

According to still further embodiments, an imager assembly for a remote inspection device includes an imager body having an imager device positioned in the imager body. A flexible tube has an outer sheathing layer and an inner shielding layer, and a first end connected to an end of the imager body using a first ferrule. A male connector is connected to a second end of the flexible tube using a second ferrule. A wiring harness is disposed through a bore of the flexible tube and through both the first and second ferrules and electrically connected to the imager device. The wiring harness includes a plurality of wires adapted to transfer a digital signal representing an image received by the imager device. A sheathing removal area at opposed ends of the flexible tube each have an exposed portion of the shielding layer. Each exposed portion further includes a flattened area adapted to engage a non-rotational engagement surface of individual ones of the first and second ferrules to minimize rotation of the flexible tube with respect to the imager body and the male connector.

According to other embodiments, a remote inspection device includes a hand held display housing having an image view screen. A male connector is connected to the hand held display housing. A flexible tube has a first end connected to the male connector using a first ferrule, and a second end. An imager body has the second end of the flexible tube connected to the imager body using a second ferrule. A circuit board assembly is positioned in the imager body having an imager device adapted to receive a visual image and convert the visual image to a digital signal. A wiring harness is disposed through a bore of the flexible tube and electrically connected to the circuit board assembly and the image view screen. The wiring harness includes a plurality of wires joined in a side-by-side configuration and two individual wires twisted together to define a twisted wire pair, the twisted wire pair operable to transfer the digital signal.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 28 is a front elevational view of the imager assembly similar to FIG. 26;

FIG. 29 is a partial cross-sectional side elevational view taken at Section 29 of FIG. 28;

DETAILED DESCRIPTION

Figure 1:
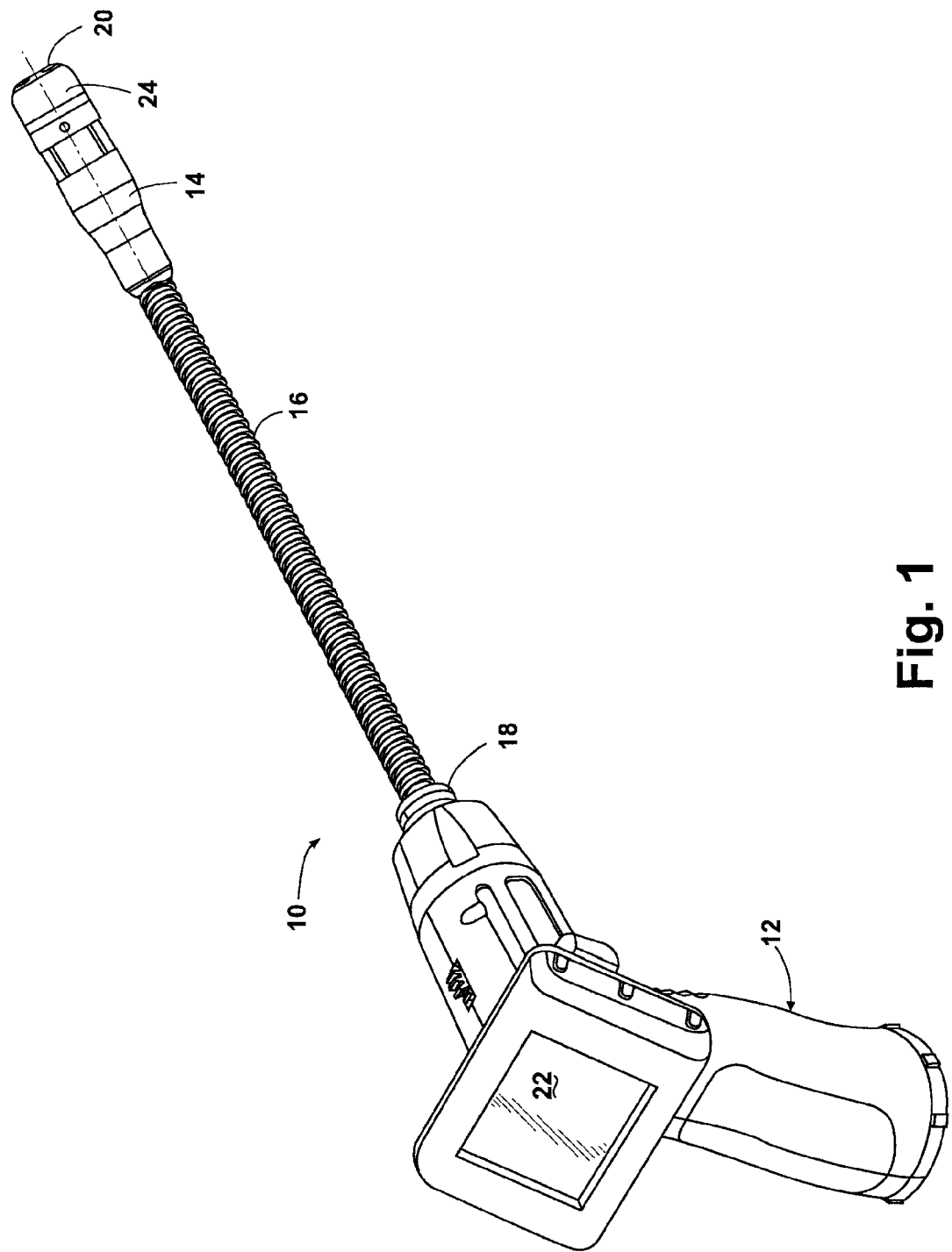
FIG. 1 is a perspective view of an imager assembly for remote inspection devices of the present disclosure.

The following description is merely exemplary in nature and is not intended to limit the present disclosure, application, or uses. It should be understood that throughout the drawings, corresponding reference numerals indicate like or corresponding parts and features.

Referring generally to FIG. 1, a remote inspection device 10 includes a hand-held display housing 12 and an imager assembly 13 including an imager head sub-assembly 14, a flexible tube 16 allowing imager head sub-assembly 14 to be remotely and movably displaced with respect to display housing 12, and a housing connection sub-assembly 18 releasably connecting flexible tube 16 to display housing 12. Imager head sub-assembly 14 includes an image receiving end 20 adapted to receive and digitally send a viewed image from imager head sub-assembly 14 to an image view screen 22 provided with display housing 12. The image view screen 22 is adapted to present an image transferred by the imager head sub-assembly as a digital signal. An imager end cap 24 is provided to releasably engage the image receiving end 20 to imager head sub-assembly 14.

Figure 2:
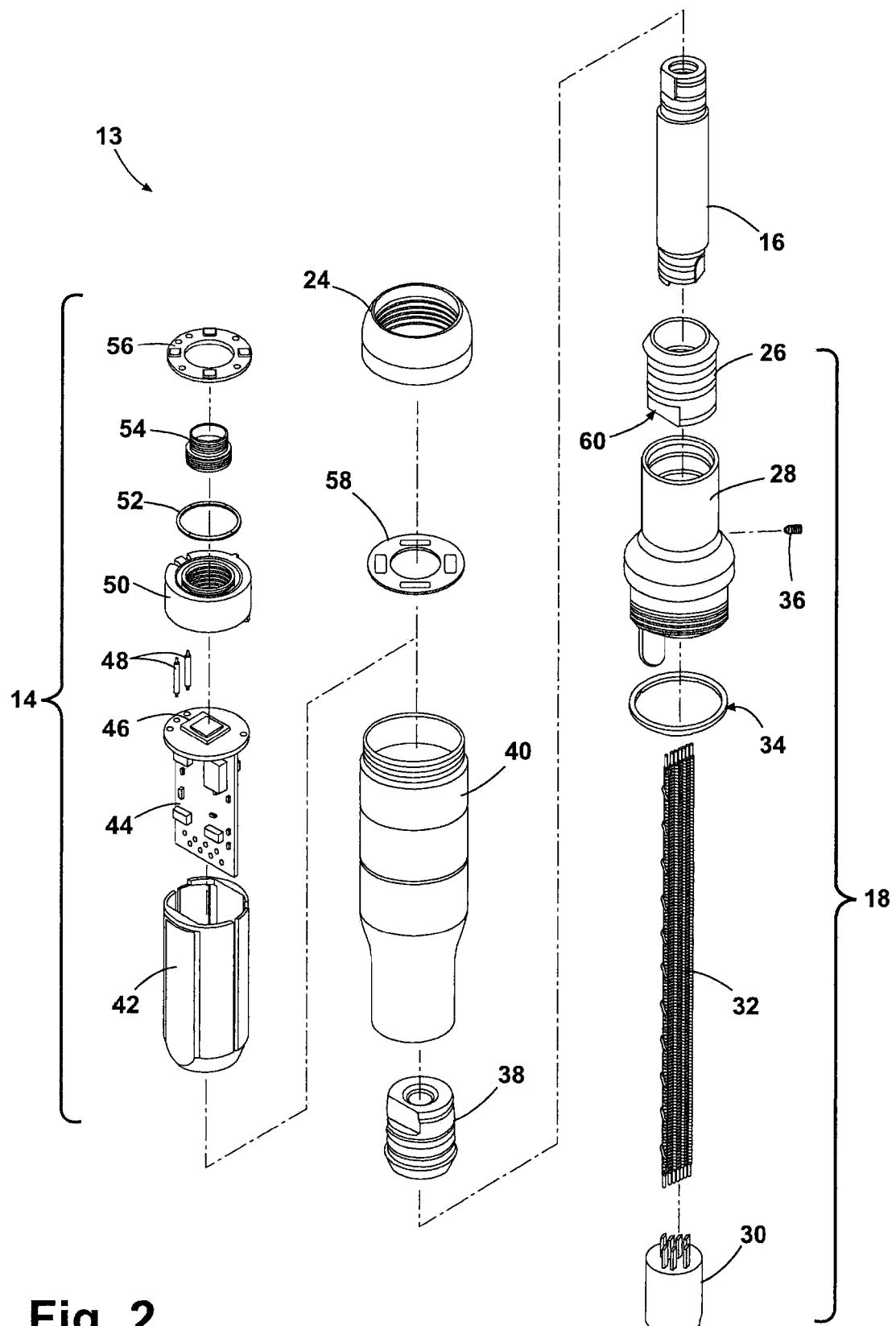
FIG. 2 is an assembly view of the component parts of the imager head sub-assembly of FIG. 1.
Figure 12:
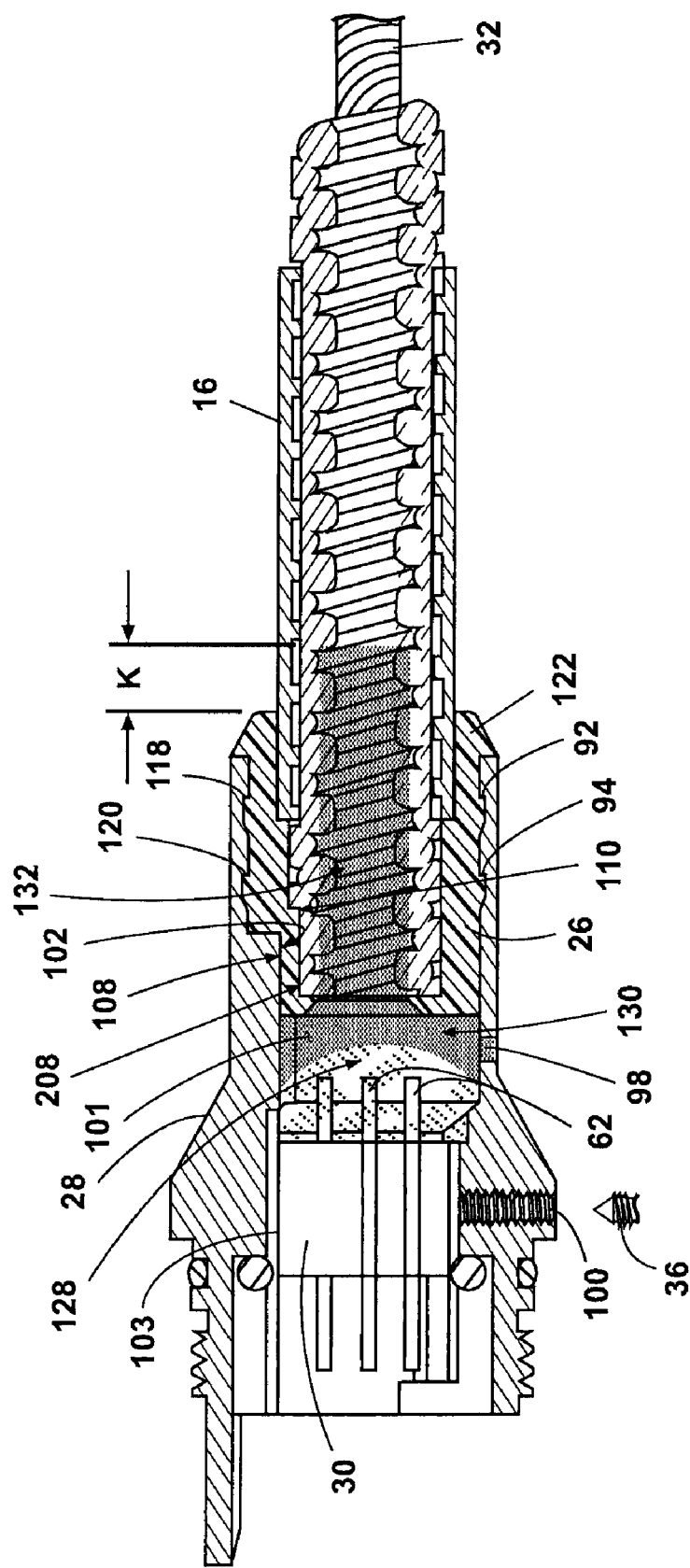
FIG. 12 is a cross-sectional side elevational view of a potted connection of the male connector of FIG. 6 and a flexible cable of the present disclosure.

Referring to FIG. 2, housing connection sub-assembly 18 includes a first ferrule 26 which is slidably received and pressed into frictional engagement with a male connector 28. A multiple pin connector 30 is provided which includes a plurality of pins which provide connection points for the multiple individual wires of a wiring harness 32 which is received through each of first ferrule 26 and male connector 28. A seal 34 such as an elastic O-ring is also provided to act as an environmental seal member between male connector 28 and display housing 12 (shown in FIG. 1). A fastener 36 such as a set screw is also provided whose use is described in reference to FIG. 12.

Wiring harness 32 provides multiple wires which pass through first ferrule 26 into a longitudinal cavity of flexible tube 16 and exit through a second ferrule 38 which is slidably received in an imager body 40. Imager head sub-assembly 14 includes second ferrule 38, imager body 40 and each of a circuit board retainer 42, a circuit board assembly 44 having an imager device 46 fixed thereto, a plurality of spacer pins 48, a lens receiving unit 50, a gasket seal 52 such as an O-ring, a lens assembly 54, and a light source board 56. Imager end cap 24 is threadably received on a free end of imager body 40 after a thermal shield 58 is positioned between light source board 56 and imager end cap 24. Wiring connections are made between the individual wires of wiring harness 32 and circuit board assembly 44.

High intensity light emitting diodes (LEDs) produce light from light source board 56 which illuminates an area in a viewing range of lens assembly 54 and imager device 46. The illuminated image received by imager device 46 is converted via circuit board assembly 44 to a digital signal and transferred via wiring harness 32 to the image view screen 22 of display housing 12 shown in FIG. 1.

Figure 3:
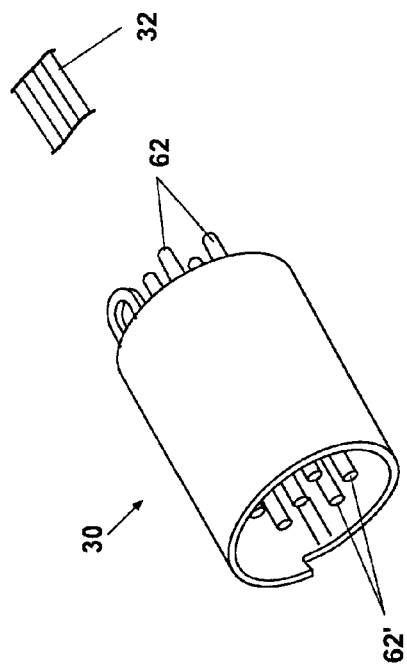
FIG. 3 is a perspective view of a multiple pin connector of the present disclosure.
Figure 5:
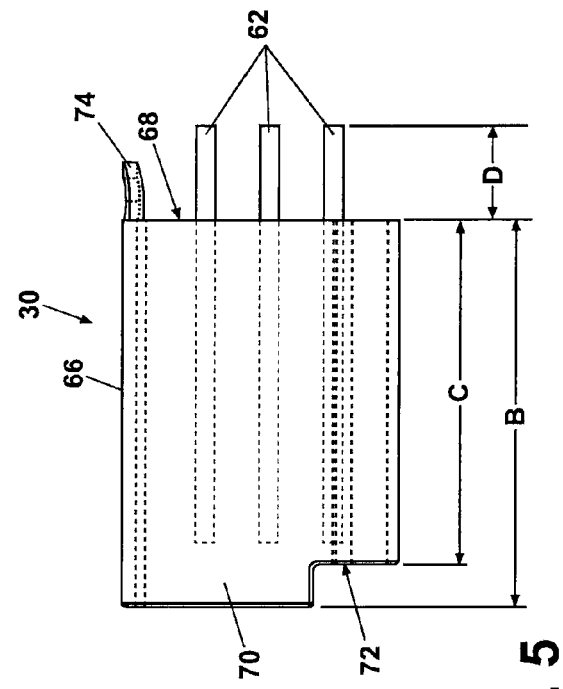
FIG. 5 is a side elevational view of the connector of FIG. 3.
Figure 4:
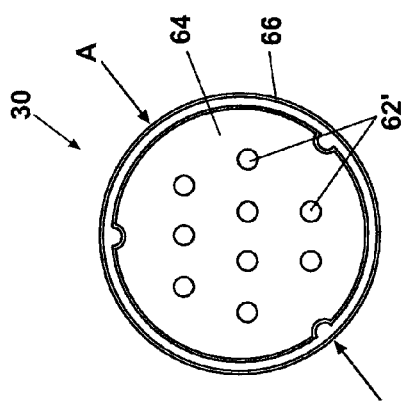
FIG. 4 is an end elevational view of the connector of FIG. 3.
Figure 6:
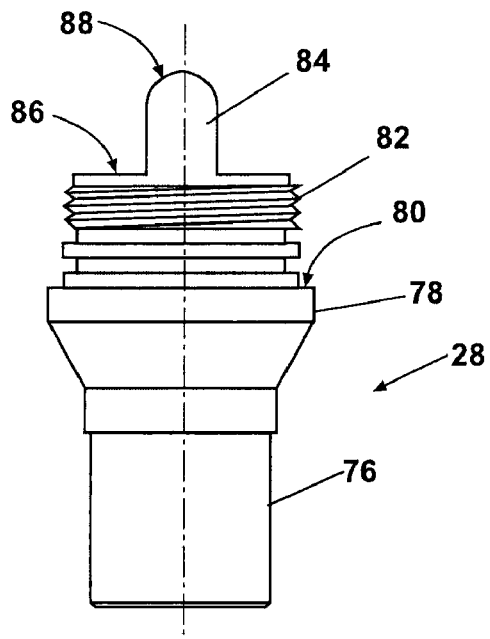
FIG. 6 is a top plan view of a male connector of the present disclosure.
Figure 7:
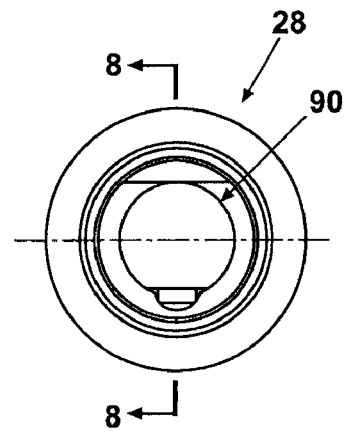
FIG. 7 is an end elevational view of the male connector of FIG. 6.

Referring to FIGS. 3, 4, and 5, multiple pin connector 30 includes a plurality of connector pins 62 accessible from opposite ends of multiple pin connector 30 for connection of individual wires of the wiring harness 32. An insulator sleeve 64 is provided within a connector tubular body 66 of multiple pin connector 30. Insulator sleeve 64 separates and spaces individual ones of the connector pins 62. Connector tubular body 66 has a body diameter "A" which is adapted to be slidably and non-rotatably received within male connector 28 which will be better described in reference to FIG. 12. Connector tubular body 66 also includes a connector end surface 68 and a body extension 70 which extends axially beyond an engagement face 72. Connector tubular body 66 has a body length "B" between connector end surface 68 and a free end of body extension 70. A body portion length "C" which is less than body length "B" is provided between connector end surface 68 and engagement face 72. Each of the plurality of connector pins 62 extend partially beyond connector end surface 66 by a common pin extension dimension "D". A deflectable engagement member 74 also extends from connector end surface 68.

Referring now to FIGS. 6 through 9, male connector 28 includes a tubular body portion 76, an engagement body portion 78 having an engagement face 80, and a plurality of male threads 82 extending longitudinally away from engagement face 80. A male engagement member 84 extends laterally away from a body end 86 which is located at a free end of male threads 82. Male engagement member 84 has a radius end 88. A through-bore 90 extends axially throughout a length of male connector 28.

Figure 8:
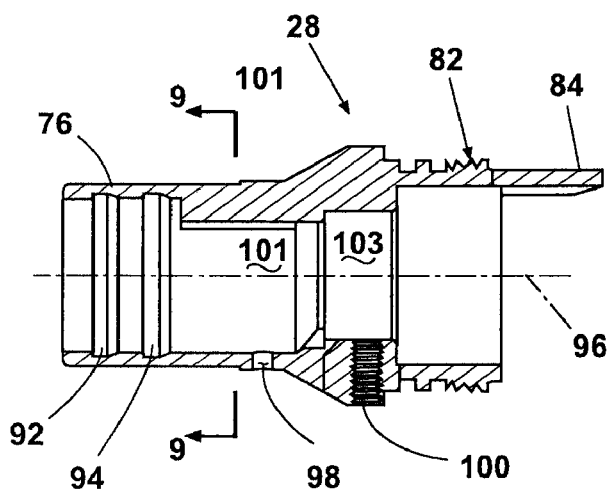
FIG. 8 is a cross-sectional side elevational view taken at Section 8 of FIG. 7.
Figure 9:
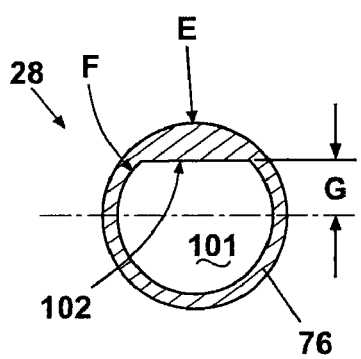
FIG. 9 is a cross-sectional end elevational view taken at Section 9 of FIG. 8.

Referring more specifically to FIG. 8, a first and a second catch ring 92, 94 are created as indentations of an inner body wall of tubular body portion 76. Each of the first and second catch rings 92, 94 have a flat end face oriented parallel with a free end of tubular body portion 76 and a conical or sloping face directed toward engagement body portion 78. This shape of first and second catch rings 92, 94 provides for a sliding installation of first ferrule 26 while the flat end faces help prevent removal of the first ferrule 26. First and second catch rings 92, 94 are formed concentrically with respect to a longitudinal axis 96 of male connector 28. A potting material insertion aperture 98 is also provided in a transition region of tubular body portion 76 proximate to engagement body portion 78. Potting insertion aperture 98 is oriented transverse to longitudinal axis 96. A female threaded aperture 100 is provided in engagement body portion 78 which is oriented parallel to potting insertion aperture 98. A ferrule receiving cavity 101 is created proximate to first and second catch rings 92, 94 adapted to slidingly receive first ferrule 26, and a pin connector receiving aperture 103 is created proximate to ferrule receiving cavity 101.

As best seen in reference to FIG. 9 and referring again to FIG. 2, tubular body portion 76 has a body outer diameter "E" and a body inner diameter "F" defining ferrule receiving cavity 101 adapted to slidingly receive first ferrule 26. An engagement surface 102 is also provided within tubular body portion 76 whose purpose will be described in reference to FIG. 12. Engagement surface 102 is positioned at en engagement surface locating dimension "G" with respect to longitudinal axis 96.

Figure 10:
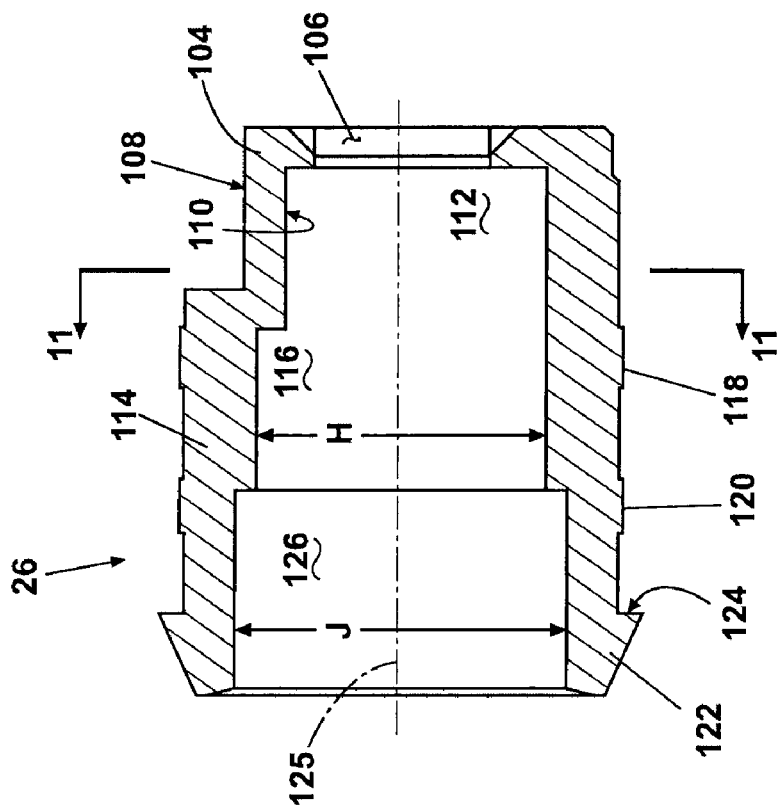
FIG. 10 is a cross-sectional side elevational view of a ferrule of the present disclosure.
Figure 11:
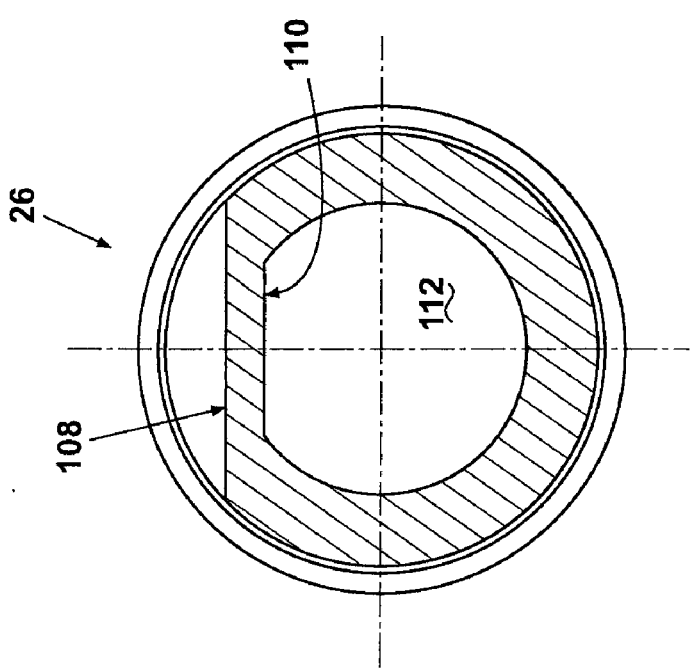
FIG. 11 is a cross-sectional end elevational view taken at Section 11 of FIG. 10.

Referring now to FIGS. 10 and 11, first ferrule 26 includes a first ferrule body portion 104 which provides a wiring through aperture 106 and a first anti-rotation engagement surface 108 on an exterior facing surface of first ferrule body portion 104. Opposed to first anti-rotation engagement surface 108 is a second anti-rotation engagement surface 110 which is provided on an inner facing wall defined by a first ferrule cavity 112. A second ferrule body portion 114 includes each of a second ferrule cavity 116 having a cavity diameter "H" and externally positioned first and second engagement rings 118, 120. A ferrule flange end 122 is provided opposite to wiring aperture 106 which includes a flange abutment face 124 which extends radially outward with respect to second ferrule body portion 114 and transverse with respect to a longitudinal axis 125 of first ferrule 26. A third ferrule cavity 126 having a cavity diameter "J" which is larger than cavity diameter "H" is located opposite to wiring aperture 106. First, second, and third ferrule cavities 112, 116, 126 are dimensioned to slidably receive flexible tube 16 which will be described in better detail in reference to FIGS. 12, 30, and 31.

As best seen in reference to FIG. 11, first and second anti-rotation engagement surfaces 108, 110 are oriented parallel to each other. First and second anti-rotation engagement surfaces 108, 110 also extend axially with respect to first ferrule cavity 112 and therefore parallel with respect to longitudinal axis 125.

Referring now to FIG. 12 and again to FIGS. 2, 8, and 10, an assembly including one end of flexible tube 16, male connector 28, multiple pin connector 30, and first ferrule 26 is shown. The assembly is constructed by first electrically fixing such as by soldering individual wire ends of the wires of wiring harness 32 to the individual connector pins 62 of multiple pin connector 30. A coating of adhesive material such as a hot-melt glue is applied at the connecting ends of connector pins 62 to create a sealed adhesive zone 128. Multiple pin connector 30 is then slidably inserted into pin connector receiving aperture 103 of male connector 28. A first end of flexible tube 16 is then prepared as better described in reference to FIGS. 30 and 31 to be engagingly received within first, second, and third ferrule cavities 112, 116, 126 of first ferrule 26. First ferrule 26 is then partially slidably inserted into the ferrule receiving cavity 101 of male connector 28 until ferrule flange end 122 of first ferrule 26 contacts the tubular body portion 76 of male connector 28. At the same time, the first anti-rotation engagement surface 108 of first ferrule 26 contacts engagement surface 102 of male connector 28 to prevent rotation of first ferrule 26 with respect to male connector 28. At this time, first and second engagement rings 118, 120 of first ferrule 26 engage within, respectively, the second and first catch rings 94, 92 of male connector 28 to prevent removal of first ferrule 26. To continue the assembly, fastener 36 is threadably inserted into threaded aperture 100 until fastener 36 engages multiple pin connector 30 to fix the position of multiple pin connector 30 within male connector 28.

A potting material zone 130 results between an end face of first ferrule 26 and the adhesive zone 128 which is subsequently filled with a potting material by injecting the potting material through potting insertion aperture 98 of male connector 28. A quantity of the potting material is inserted to fill the remaining void space of ferrule receiving cavity 101 and also to backfill an internal portion 132 of flexible tube 16 out to a distance represented by potting material extension dimension "K" measured from a free end of ferrule flange end 122. According to several embodiments a volume of approximately 1.0 cc of potting material is used in each application to provide a consistent volume of potting material between assemblies.

Figure 13:
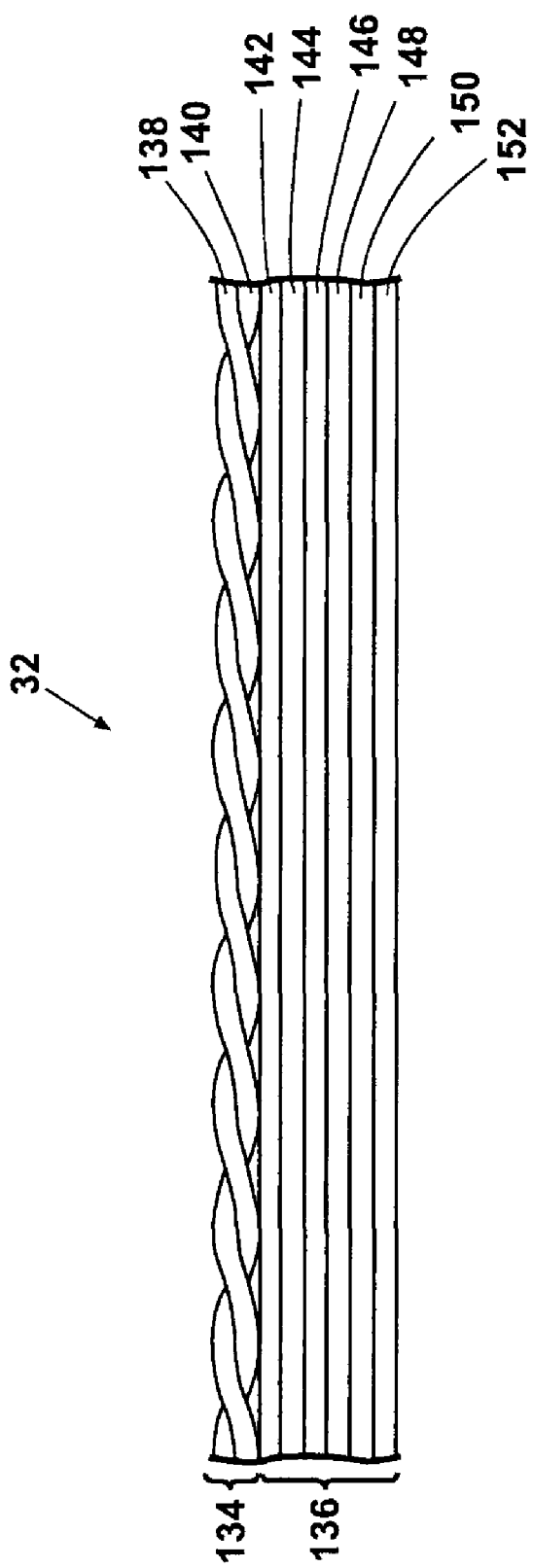
FIG. 13 is a top plan view of a bonded assembly of a wiring harness including a looped pair of wires.

Referring to FIG. 13, according to several embodiments, wiring harness 32 provides eight individual wires which are joined together such as by bonding together to form wiring harness 32. Two groups of wires are provided with wiring harness 32. These include a twisted wire pair 134 joined or bonded to a side-by-side configuration of a joined wire group 136 having six wires which can be joined for example by joining the wires for example by a molding operation that commonly insulates the wires from each other. Twisted wire pair 134 includes each of a low voltage differential signal (LVDS) wire 138 defining a positive lead and a low voltage differential signal (LVDS) wire 140 defining a negative lead. An amount of twist defined as the number of turns of the two wires of the twisted wire pair 134 over a length of the twisted wire pair 134 is controlled to produce each of a defined impedance and a defined capacitance. According to several embodiments twisted wire pair 134 has a defined impedance of approximately 100 ohms and a defined capacitance of less than 30 pico-farrads per meter of length.

The individual wires of joined wire group 136 include each of a power ground wire 142, a power (+5 volts) wire 144, a two wire interface (CLK) wire 146, a two wire interface (DATA) wire 148, a high intensity LED power wire 150 defining a positive lead, and a high intensity LED power wire 152 defining a negative lead. It is desirable to separate the wires of twisted wire pair 134 from the high intensity LED power wires 150, 152 to minimize interference with the signals transferred via the twisted wire pair 134.

Figure 14:
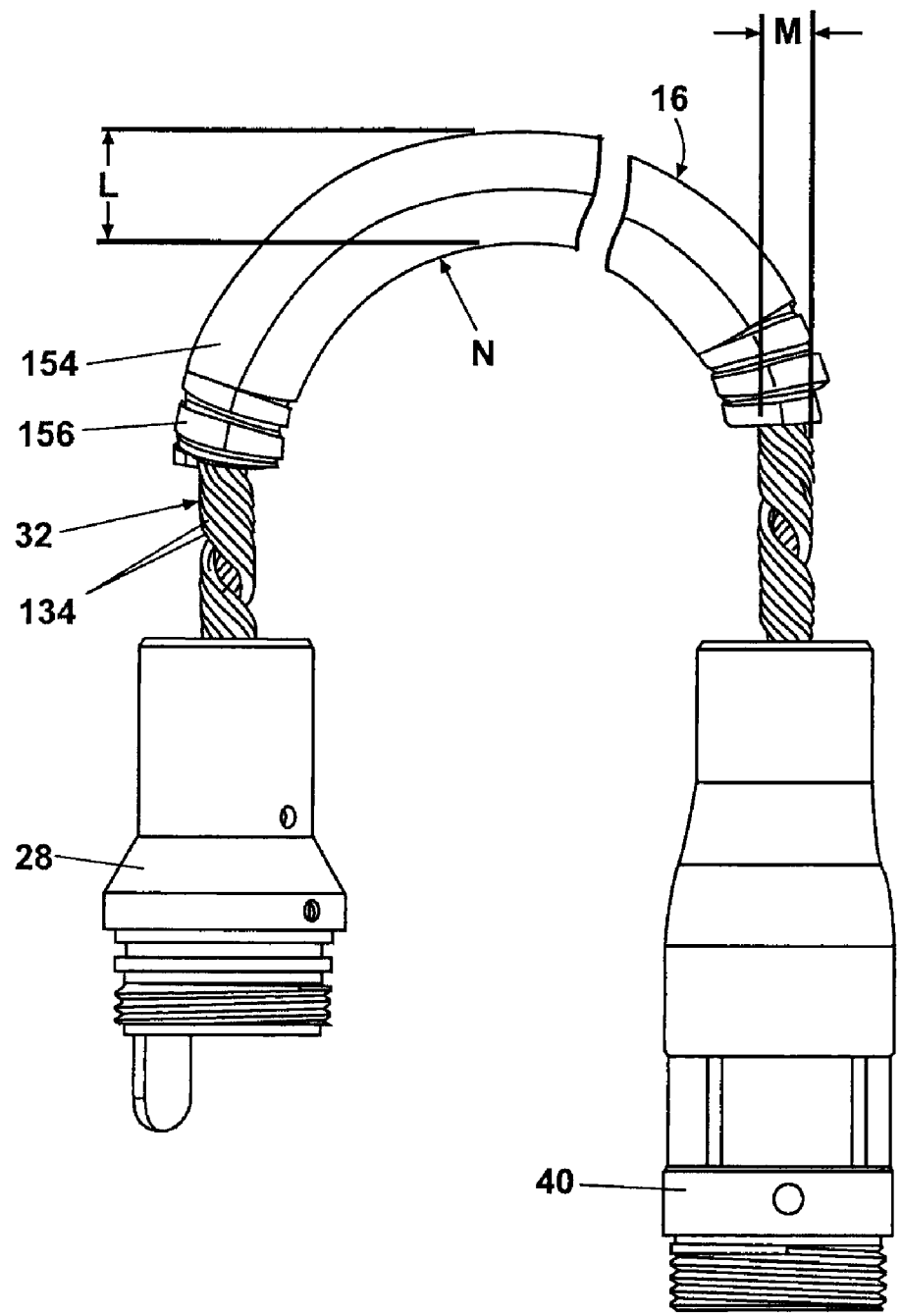
FIG. 14 is a side elevational view showing an exemplary twisted configuration of the wiring harness of FIG. 13 between connectors of the present disclosure.

Referring to FIG. 14, an exemplary embodiment having wiring harness 32 connected to each of male connector 28 and imager body 40 is shown. In this embodiment, the entire wiring harness 32 including twisted wire pair 134 is twisted to a diameter which can be slidably received within a longitudinal cavity or bore of flexible tube 16. Flexible tube 16 includes each of an outer sheathing layer 154 and an inner shielding layer 156. Flexible tube 16 defines a cable outer diameter "L" and wiring harness 32 is twisted to a wiring harness twist diameter "M" to slidably fit within inner shielding layer 156. Wiring harness 32 should be capable of a sliding/extending motion within flexible tube 16 so that flexible tube 16 can be bent to a minimum bend radius "N" without breaking any of the electrical connections of the individual wires at either male connector 28 or the circuit board assembly 44 within imager body 40 (described in reference to FIG. 2).

Figure 16:
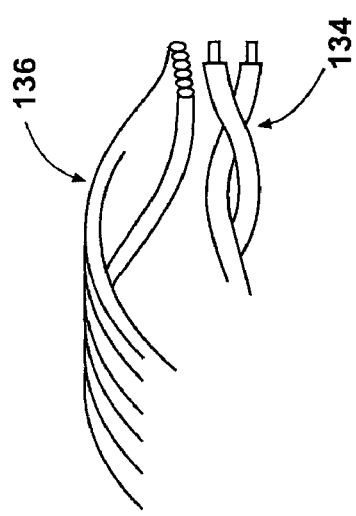
FIG. 16 is a side elevational view of a twisted configuration of the wiring harness of FIG. 15.
Figure 15:
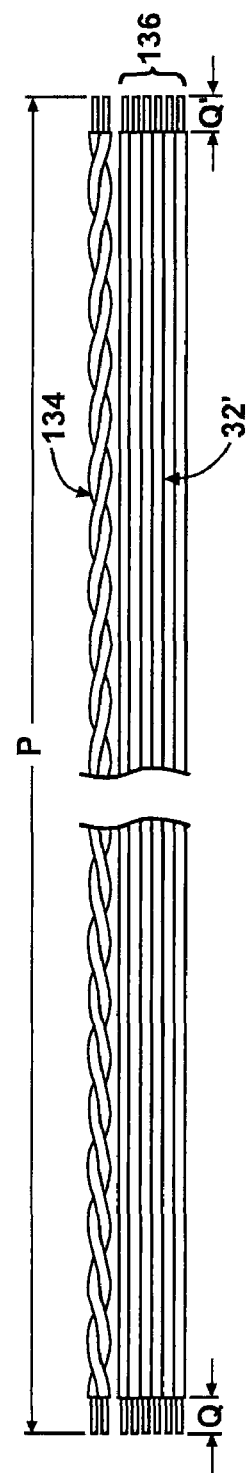
FIG. 15 is a top plan view of another embodiment of a wiring harness having each of a bonded group of wires and a separate looped pair of wires.

Referring to FIGS. 15 and 16, according to other embodiments a modified wiring harness 32' separates twisted wire pair 134 from joined wire group 136. This permits joined wire group 136 to be wound or coiled about twisted wire pair 134 such that twisted wire pair 134 is positioned in a central channel or longitudinal bore defined within joined wire group 136. A total wiring coiled length "P" also includes each of a stripped end length "Q", "Q"' to accommodate the stripped wire length needed to make the individual electrical connections. The twisted wire pair 134 is freely disposed with respect to the plurality of individual wires joined in a side-by-side configuration of joined wire group 136, the plurality of wires joined in the side-by-side configuration being twisted to a diameter adapted to slidably fit within the flexible tube 16 and the twisted wire pair 134 being disposed within the longitudinal cavity defined within the twisted plurality of wires.

Figure 17:
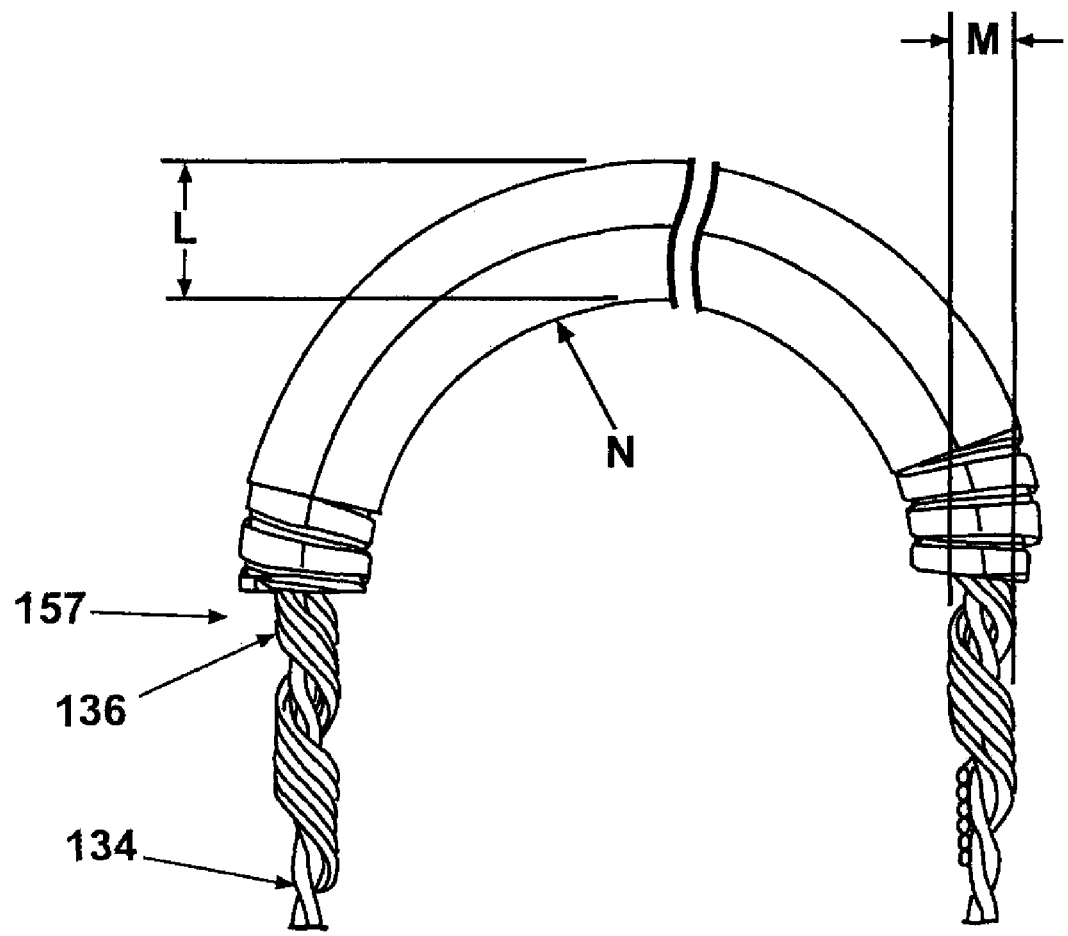
FIG. 17 is a side elevational view of the wiring harness of FIG. 15 having the looped pair of wires disposed within a coiled configuration of the bonded wires.

Referring to FIG. 17, a second wiring embodiment 157 is provided by individually coiling joined wire group 136 and disposing twisted wire pair 134 within the central bore defined by joined wire group 136. The cable outer diameter "L", the wiring harness twist diameter "M", and the minimum bend radius "N" are retained in this embodiment.

Figure 18:
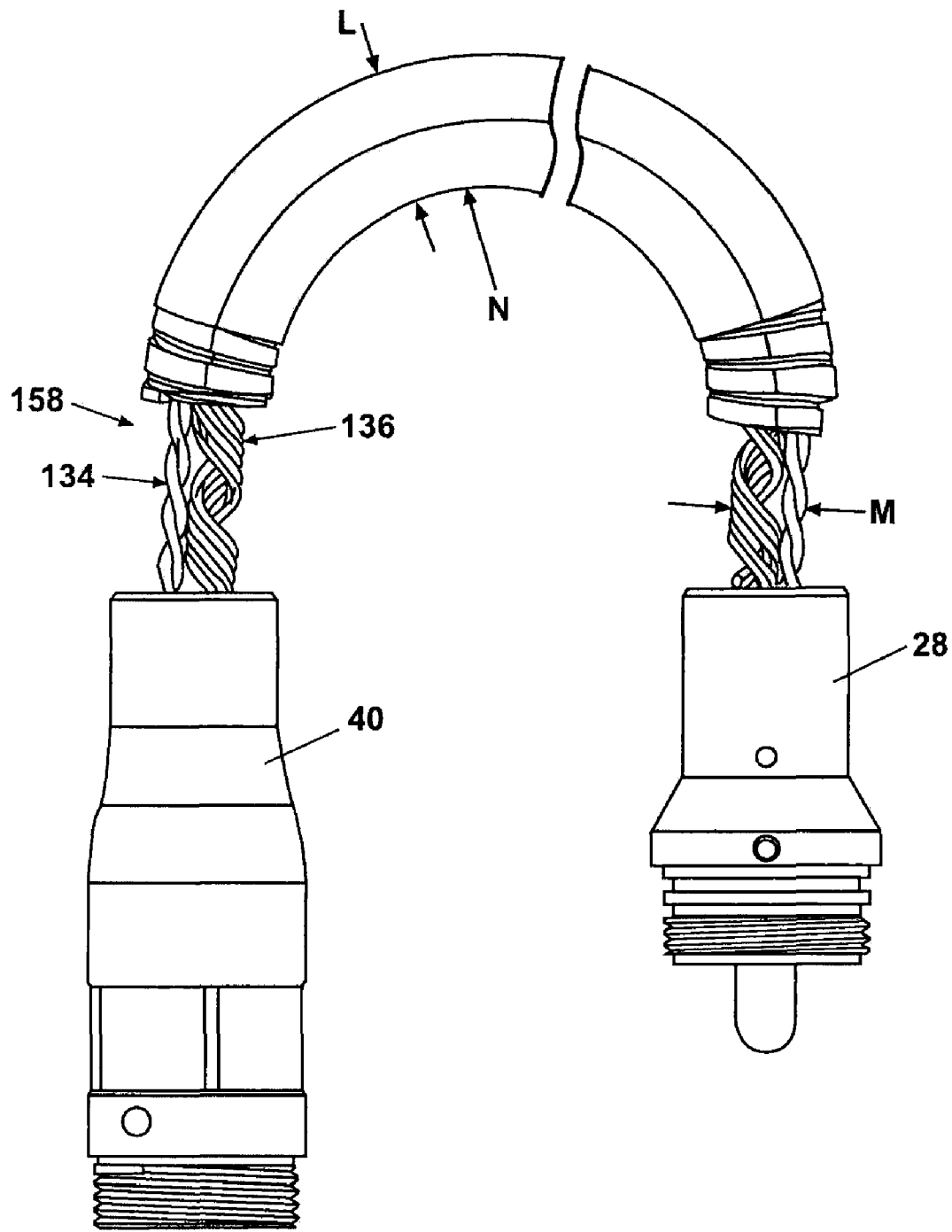
FIG. 18 is a side elevational view similar to FIG. 14 showing the wiring harness of FIG. 15 having the looped pair of wires running outside of a twisted configuration of the bonded wires.
Figure 22:
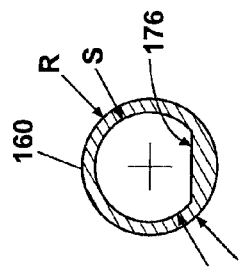
FIG. 22 is a cross-sectional top plan view taken at Section 22 of FIG. 19.
Figure 21:
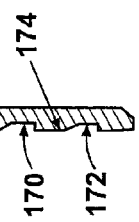
FIG. 21 is a partial cross-sectional view of a portion of the device wall of FIG. 20.
Figure 20:
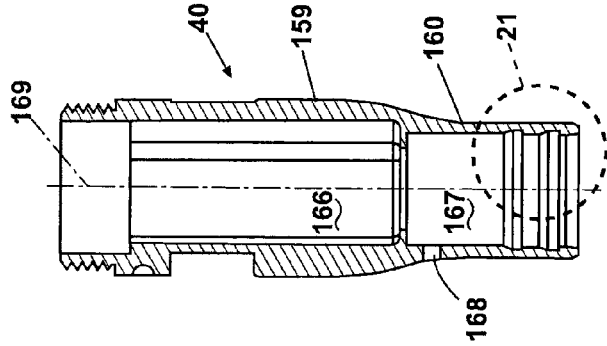
FIG. 20 is a cross-sectional side elevational view taken at Section 20 of FIG. 19.
Figure 19:
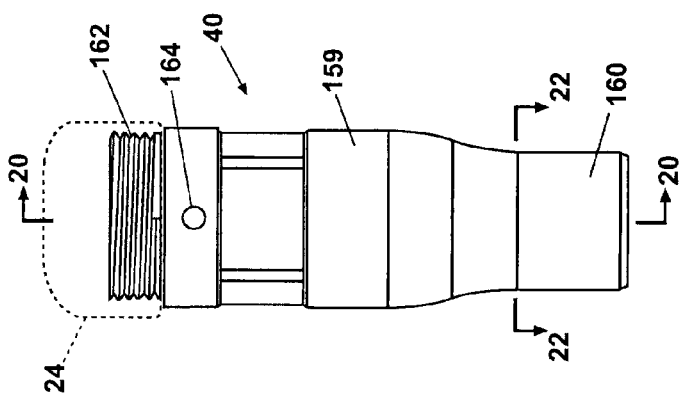
FIG. 19 is a side elevational view of an imager body.

Referring to FIG. 18, a third wiring embodiment 158 is created by coiling the wires of joined wire group 136 and inserting the coiled joined wire group 136 within inner shielding layer 156 independently of twisted wire pair 134 such that twisted wire pair 134 is positioned outside of the twisted joined wire group 136 as shown. This configuration may result in a larger total diameter of the combined twisted wire pair 134 and joined wire group 136, however it is desirable to retain the cable outer diameter "L", the wiring harness twist diameter "M", and the minimum bend radius "N" of the previous embodiments.

Referring now to FIGS. 19 through 22, imager body 40 includes a first body portion 159 defining a first end, a second body portion 160 defining a second end, and a male threaded end 162 extending from first body portion 159 opposite from second body portion 160. Male threaded end 162 is adapted to threadably receive imager end cap 24 (shown in phantom). A locator cavity 164 can also be provided proximate to male threaded end 162 to use as an orientation device when imager body 40 is assembled into imager head sub-assembly 14 (shown in reference to FIG. 1 and 2). A first portion aperture 166 is created through first body portion 159 and each of a second portion aperture 167 and a potting material insertion aperture 168 are created through second body portion 160 having potting material insertion aperture 168 oriented transverse to a longitudinal axis 169 of imager body 40. First and second catch rings 170, 172 which are similar in design and function to first and second catch rings 92, 94 of male connector 28 are similarly created on a tubular body wall 174 of second body portion 160. Second body portion 160 has a tubular body outside diameter "R" and a tubular body inside diameter "S". An anti-rotation contact surface 176 is also formed within second portion aperture 167 of second body portion 160.

Figure 24:
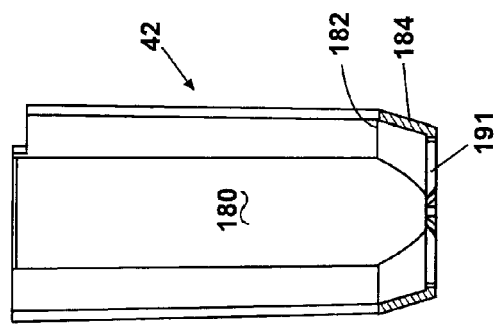
FIG. 24 is a front elevational view of the circuit board retainer of FIG. 23.
Figure 25:
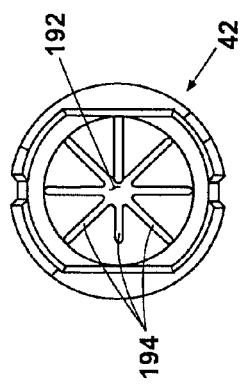
FIG. 25 is a top plan view of the circuit board retainer of FIG. 23.
Figure 23:
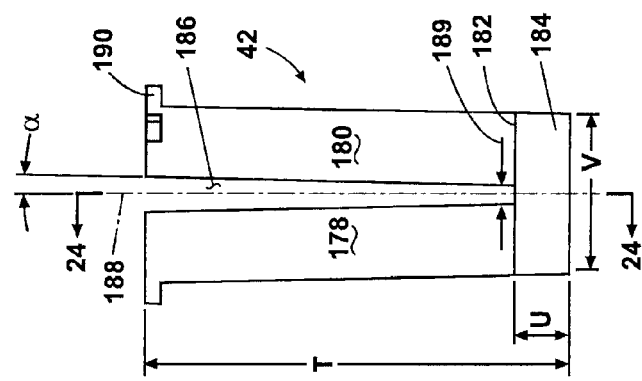
FIG. 23 is a side elevational view of a circuit board retainer.

Referring now to FIGS. 23 through 25, circuit board retainers 42 of the present disclosure can be a polymeric material to permit each of a first and second leg 178, 180 which commonly extend from a leg junction 182 to be molded. A conical body portion 184 extends away from leg junction 182 with respect to each of first and second legs 178, 180. A tapered slot 186 is created between first and second legs 178, 180 in an "as-molded" condition. Tapered slot 186 defines an angle a between each of the first and second legs 178, 180 and a longitudinal axis 188. Tapered slot 186 is provided to create a bias force as first and second legs 178, 180 are pressed toward each other when circuit board retainer 42 is inserted into imager body 40. A minimum spacing 189 is provided for tapered slot 186 proximate to leg junction 182 which is substantially equal to a thickness of a circuit board which is received within tapered slot 186. Circuit board retainer 42 has a total height "T" and conical body portion 184 has a conical portion height "U". Conical portion height "U" and the taper of conical body portion 184 are predetermined to permit circuit board retainer 42 to be aligned for insertion into imager body 40.

Circuit board retainer 42 also includes a radial flange 190 which extends radially outward from each of first and second legs 178,180 to provide a positive stop for insertion of circuit board retainer 42 into imager body 40. An end wall 191 has a wire receiving orifice 192 created therein. Individual wires of wiring harness 32 extend through wire receiving orifice 192 when imager head sub-assembly 14 is completed. A plurality of longitudinal slots 194 which are angled with respect to each other extend outwardly from wire receiving orifice 192. Longitudinal slots 194 provide some flexibility of end wall 191 for insertion of the individual wires of wiring harness 32. A second function of the longitudinal slots 194 is to provide for overflow paths for the potting material used to solidify the area of the wiring connections of imager head sub-assembly 14 which will be described in greater detail in reference to FIGS. 28 and 29.

Figure 26:
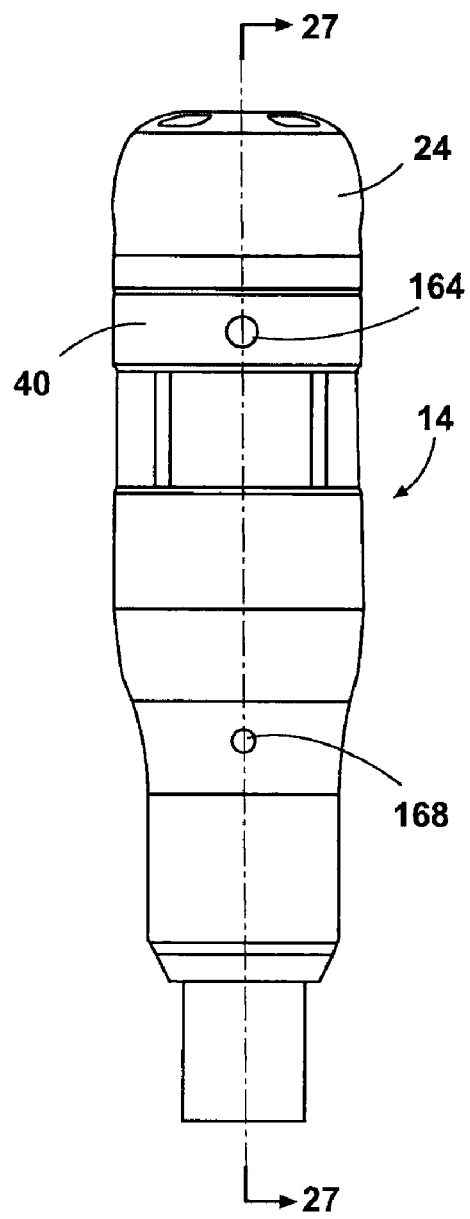
FIG. 26 is a front elevational view of an imager assembly.

Referring now to FIG. 26, the completed assembly of imager head sub-assembly 14 includes imager end cap 24 threadably connected to imager body 40. Potting material insertion aperture 168 is also shown co-axially aligned with locator cavity 164.

Figure 27:
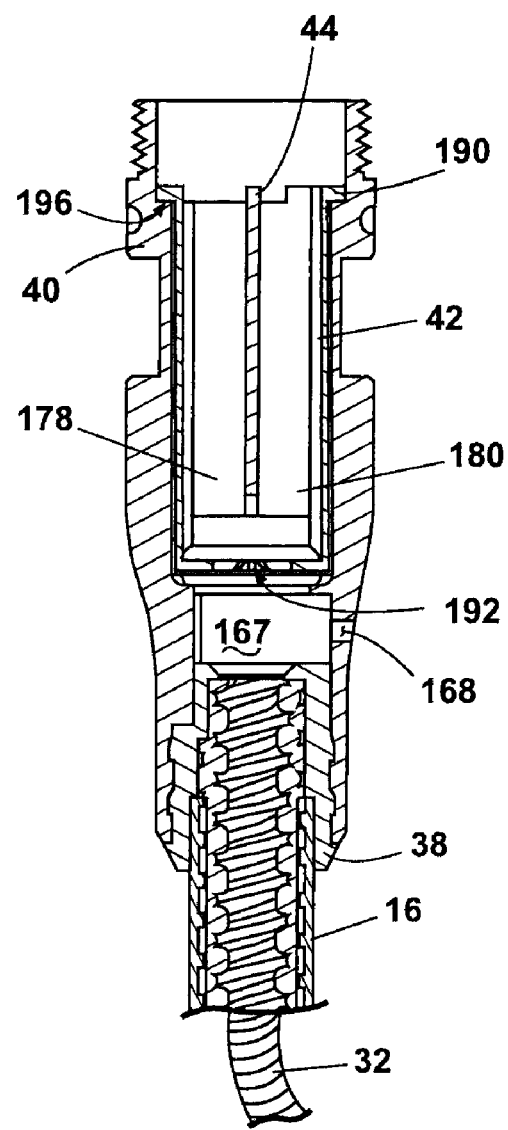
FIG. 27 is a cross-sectional side elevational view taken at Section 27 of FIG. 26.

Referring to FIG. 27, imager end cap 24 has been removed for clarity to show the insertion of circuit board retainer 42 into imager body 40. With further reference to FIGS. 23 though 25, as circuit board retainer 42 is inserted into imager body 40 first and second legs 178, 180 deflect toward one another and thereby frictionally engage circuit board assembly 44. Circuit board retainer 42 is inserted until radial flange 190 contacts an engagement face 196 of imager body 40. Circuit board assembly 44 is therefore spaced with respect to imager body 40 and insulated by circuit board retainer 42 from the metal material (such as aluminum) of imager body 40. The individual wires of wiring harness 32 which extend from flexible tube 16 through second ferrule 38 extend through wire receiving orifice 192 and are electrically connected to circuit board assembly 44. Second ferrule 38 is then slidably engaged within imager body 40 in a similar manner as previously described with respect to first ferrule 26. An unfilled remaining portion of second portion aperture 167 is then filled with potting material using potting material insertion aperture 168.

Referring now to FIGS. 28 and 29, an imager assembly length "W" is provided when imager end cap 24 is threadably engaged. Potting material insertion aperture 168 is sized to permit an injection pin (not shown) to be received for insertion of the potting material into a potting material receiving cavity 198 which is the remaining unfilled portion of second portion aperture 167. Potting material injection through potting material insertion aperture 168 also back-fills an internal portion of flexible tube 16 as previously described in reference to FIG. 12. Potting material extends as a minimum from a first potting material boundary 200 defined by end wall 191 and a second potting material boundary 202 defined by an end of second ferrule 38.

Figure 30:
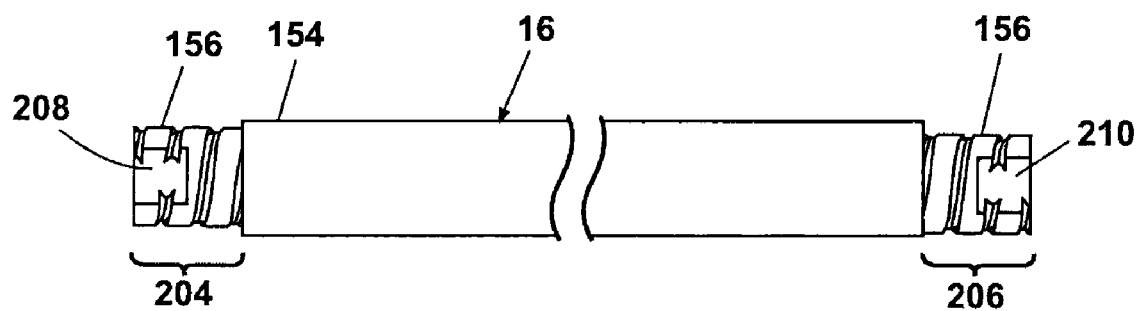
FIG. 30 is a top plan view of the flexible cable of the present disclosure having an outer sheathing removed at opposite ends.
Figure 31:
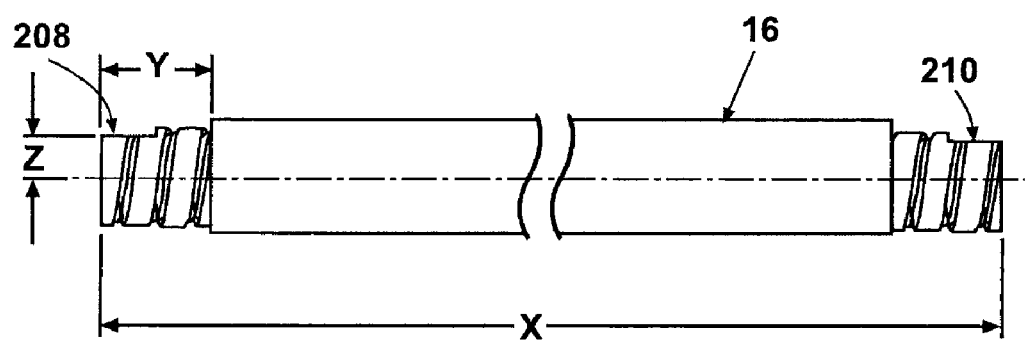
FIG. 31 is a side elevational view of the flexible cable of FIG. 16.

Referring now to FIGS. 30 and 31, prior to insertion of flexible tube 16 into the various ones of first and second ferrules 26, 38 a portion of the outer sheathing layer 154 is removed from opposite ends of flexible tube 16 to expose portions of the inner shielding layer 156. This defines each of a first sheathing removal area 204 and a second sheathing removal area 206. Each of the first and second sheathing removal areas 204, 206 have a sheathing removal length "Y. Portions of the exposed shielding layer 156 of each of the first and second sheathing removal areas 204, 206 are flattened by removing material from inner shielding layer 156, for example by filing or grinding to create each of a first and a second flattened area 204, 206. The first and second flattened areas 208, 210 are dimensionally controlled to a flattened area spacing dimension "Z". First and second sheathing removal areas 204, 206 are created after a total cable length "X" is determined for the specific remote inspection device required. Referring again to FIG. 12, the position and orientation of first flattened area 208 is pre-defined such that first flattened area 208 abuts with second anti-rotation engagement surface 110 of first ferrule 26. This abutment prevents rotation of flexible tube 16 with respect to male connector 28. A similar engagement of second flattened area 210 with a second anti-rotation engagement surface 110' (not shown) of second ferrule 38 is also provided for the same purpose.

Figure 32:
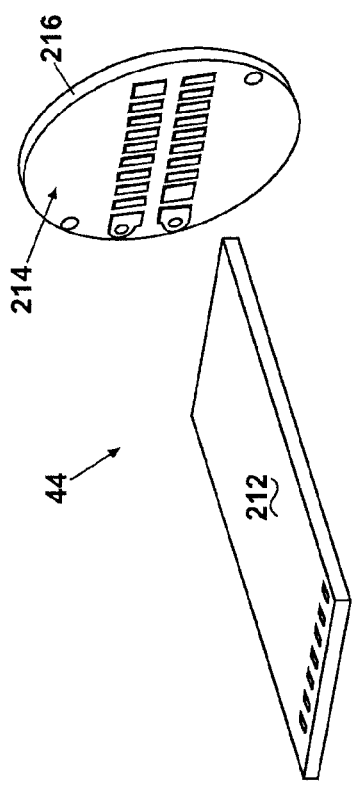
FIG. 32 is a front perspective view of the component parts of a circuit board assembly of the present disclosure.
Figure 34:
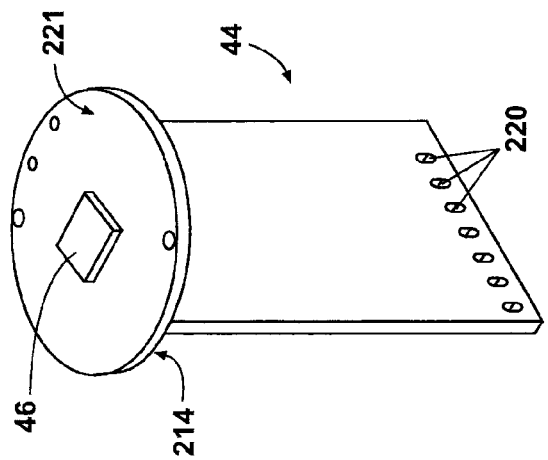
FIG. 34 is a side perspective view of the circuit board assembly of FIG. 33.
Figure 33:
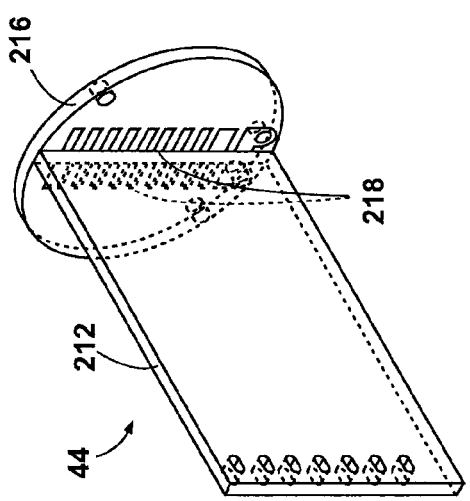
FIG. 33 is front perspective view of the assembled circuit board assembly of FIG. 32.

Referring to FIGS. 32 through 45 a plurality of circuit board assemblies can be used with the imager head sub-assembly 14 of the present disclosure. With specific reference to FIG. 32, in a first embodiment of circuit board assembly 44 a first printed circuit board 212 is oriented for electrical connection with a circuit board face 214 of a second printed circuit board 216. As shown in FIG. 33, a plurality of electrical connections (solder joints) 218 are then created to fixedly join first printed circuit board 212 to second printed circuit board 216, with first printed circuit board 212 oriented transverse to second printed circuit board 216. As best seen in reference to FIG. 34, a plurality of wiring receiving and connection apertures 220 are provided at a free end of first printed circuit board 212 to receive the individual wires (not shown) of wiring harness 32. Imager device 46 is mounted to a second circuit board face 221 oppositely directed from circuit board face 214.

Figure 35:
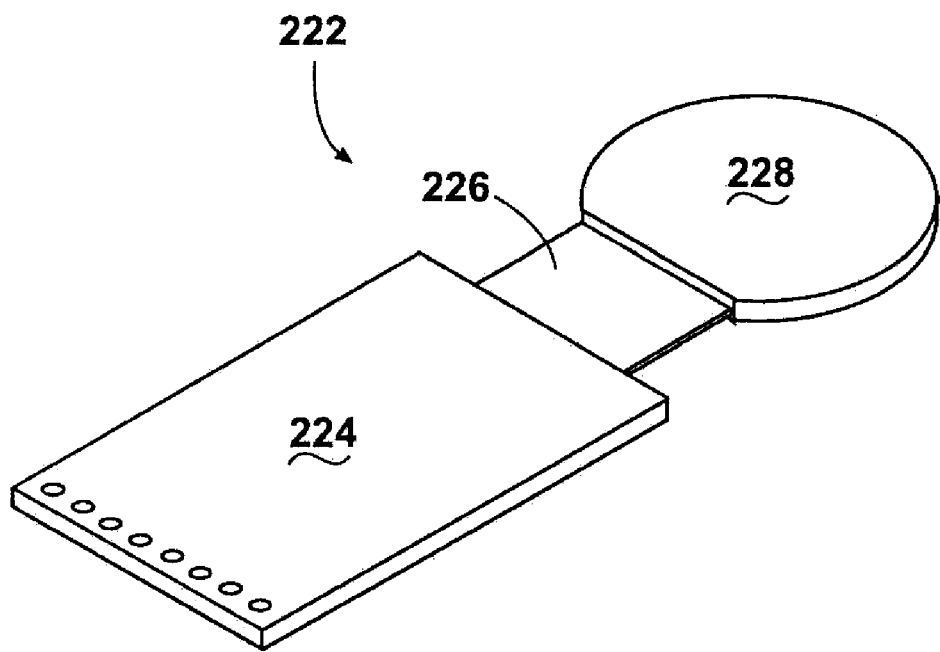
FIG. 35 is a top perspective view of another embodiment of a circuit board assembly.
Figure 36:
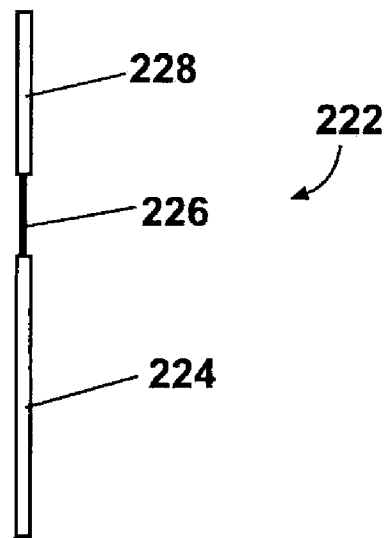
FIG. 36 is a side elevational view of the circuit board assembly of FIG. 35.

Referring to FIGS. 35 and 36, in another embodiment a flexible circuit board assembly 222 includes a printed circuit board 224 connected by a flexible cable 226 to a circular shaped printed circuit board 228. Flexible cables as referred to herein can include ribbon cables.

Figure 37:
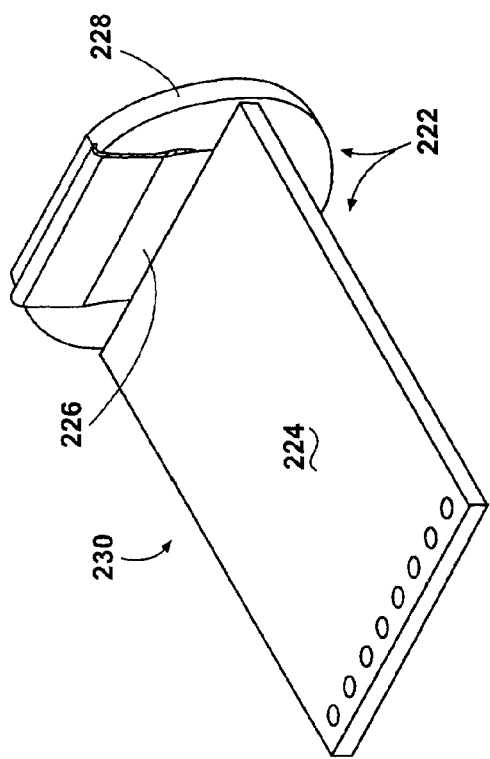
FIG. 37 is a top perspective view of a further embodiment of a circuit board assembly.
Figure 38:
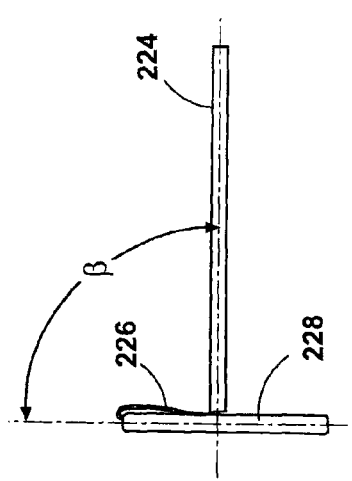
FIG. 38 is a side elevational view of the circuit board assembly of FIG. 37.

Referring now to FIGS. 37 and 38, the components of flexible circuit board assembly 222 are combined and oriented as shown to create a second flexible circuit board assembly 230 having printed circuit board 224 oriented at an angle β which according to several embodiments is approximately 90 degrees with respect to circular shaped printed circuit board 228. The flexibility of flexible cable 226 permits the orientation of second flexible circuit board assembly 230 while maintaining electrical continuity between printed circuit board 224 and circular shaped-printed circuit board 228.

Figure 39:
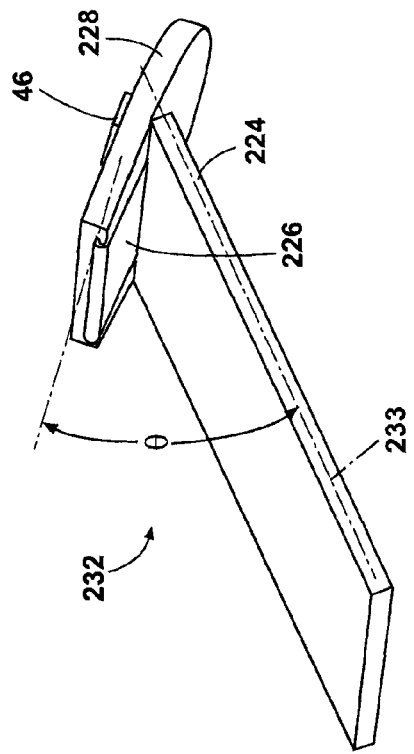
FIG. 39 is a top perspective view of a modified embodiment the circuit board assembly of FIG. 37.

Referring to FIG. 39, a third flexible circuit board assembly 232 is created by modifying the previously described second flexible circuit board assembly 230 by re-orienting the circular-shaped printed circuit board 228 at an angle θ defining an acute angle with respect to printed circuit board 224. This orientation of third flexible circuit board assembly 232 permits the imager device 46 to be oriented at an angle with respect to a longitudinal axis 233 of printed circuit board 224 which is co-axially aligned with a longitudinal axis (not shown) of the imager head sub-assembly 14. Angle θ can be selected as any acute angle and in several embodiments is selected as a 45 degree angle.

Figure 40:
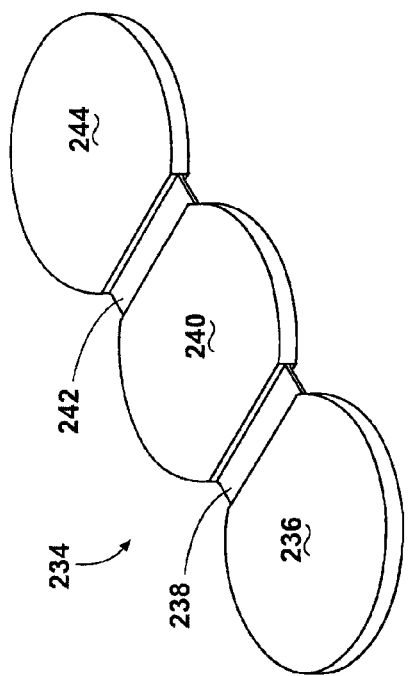
FIG. 40 is a top perspective view of a further embodiment of a circuit board assembly.
Figure 41:
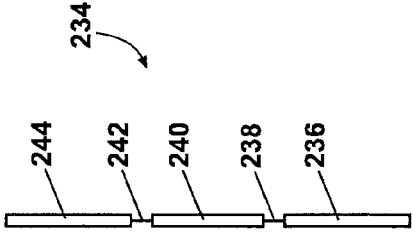
FIG. 41 is a side elevational view of the circuit board assembly of FIG. 40.

Referring now to FIGS. 40 and 41, a fourth flexible circuit board assembly 234 is created by joining a first circular-shaped circuit board 236 using a flexible cable 238 to a second circular-shaped circuit board 240 and connecting the second circular-shaped circuit board 240 using a flexible cable 242 to a third circular-shaped circuit board 244.

Figure 43:
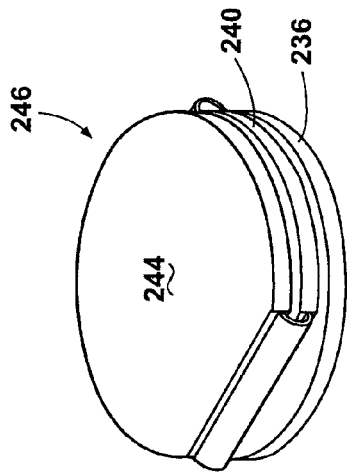
FIG. 43 is a side perspective view of the circuit board assembly of FIG. 42.
Figure 42:
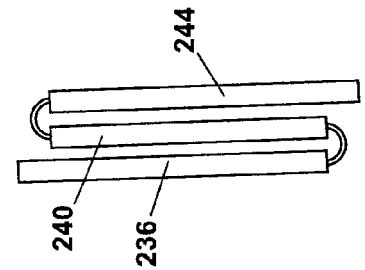
FIG. 42 is a side elevational view of the circuit boards of the circuit board assembly of FIG. 40 modified to change the circuit board orientations.

Referring to FIGS. 42 and 43, by orienting the first, second and third circular-shaped circuit boards 236, 240, 244 of fourth flexible circuit board assembly 234 in the arrangement shown a flat assembly 246 can be achieved. Flat assembly 246 provides a benefit of a reduced total length of the circuit board assembly compared to the previously described circuit board assemblies such as second flexible circuit board assembly 230 which requires the printed circuit board 224 to extend to its full length within imager body 40. In contrast, flat assembly 246 positions all of the associated circular-shaped circuit boards proximate and facing each other which can permit elimination of circuit board retainer 42.

Figure 44:
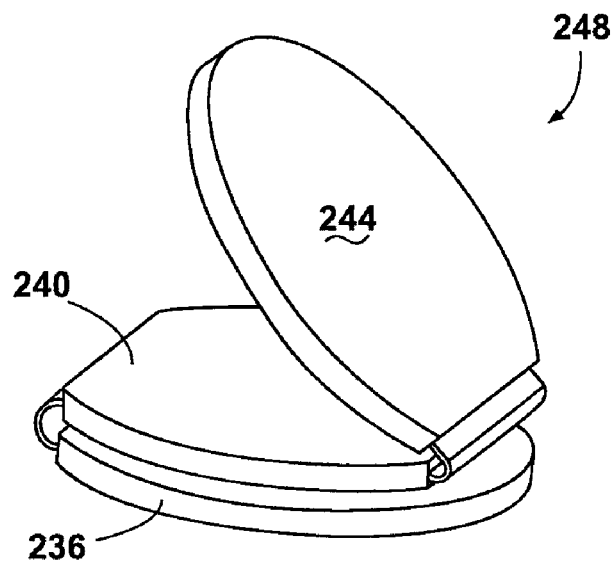
FIG. 44 is a side perspective view of the circuit board assembly of FIG. 43 modified to re-orient of the circuit boards at an acute angle with respect to the other circuit boards.
Figure 45:
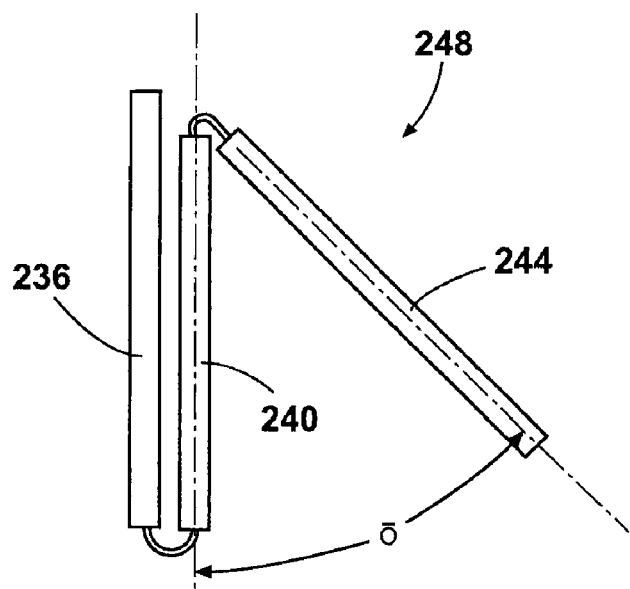
FIG. 45 is a side elevational view of the circuit board assembly of FIG. 44.

Referring now to FIGS. 44 and 45, the flat assembly 246 previously described with respect to FIGS. 42 and 43 is modified by orienting the third circular-shaped circuit board 244 at an angle δ with respect to each of the first and second circular-shaped circuit boards 236, 240. Angle δ can be any acute angle and is selected in several embodiments as a 45 degree angle. This configuration of circuit boards provides a similar benefit as previously described with respect to third flexible circuit board assembly 232 shown in FIG. 39.

What is claimed is:

1. An imager assembly for a remote inspection device, comprising:
   an imager body;
   a circuit board retainer slidably received through an end of the imager body, the circuit board retainer having deflectable first and second legs separated by a tapered slot, the tapered slot defining an angle between each of the first and second legs and a longitudinal axis of the circuit board retainer, the slot permitting a bias force to be created when the first and second legs are pressed toward each other as the circuit board retainer is slidably received in the imager body; and a circuit board assembly having an imager device connected to a first circuit board of the circuit board assembly, and a second circuit board electrically connected to the first circuit board, the second circuit board received in the tapered slot of the circuit board retainer and frictionally engaged by the deflectable legs when the first and second legs are pressed toward each other when the circuit board retainer is inserted into the imager body.

2. The imager assembly of claim 1, further including:

a multiple pin connector received through a second end of the imager body having connector pins extending therefrom;

a coating of adhesive material applied at connecting ends of the connector pins to create a sealed adhesive zone; and a first ferrule slidably inserted in the second end of the imager body after the multiple pin connector is received, the first ferrule adapted to engage and retain a flexible tube having a wiring harness slidably disposed in the flexible tube.

3. The imager assembly of claim 2, further including a potting material insertable into a space between the sealed adhesive zone at the multiple pin connector and the circuit board retainer after electrical connection of the wiring harness to the circuit board assembly, the potting material also extending into an internal portion of the flexible tube and surrounding the wiring harness for a predetermined distance beyond the first ferrule.

4. The imager assembly of claim 1, wherein the circuit board retainer further includes:

a radial flange adapted to abut against an engagement face of the imager body;

an end wall having a wire receiving orifice created therein; and a plurality of longitudinal slots angled with respect to each other extending outwardly from the wire receiving orifice providing flexibility of the end wall during insertion of individual wires of a wiring harness.

5. The imager assembly of claim 1, further including a plurality of solder joints fixedly connecting the first and second circuit boards with the first circuit board transversely oriented with respect to the second circuit board.

6. The imager assembly of claim 1, wherein the circuit board assembly is a flexible circuit board assembly having a ribbon cable connecting the first and second circuit boards, such that the first circuit board is selectively angularly oriented with respect to the second circuit board.

7. The imager assembly of claim 1, wherein the circuit board assembly is a flexible circuit board assembly having a ribbon cable connecting the first and second circuit boards, with the first circuit board oriented at an acute angle with respect to the second circuit board.

8. The imager assembly of claim 1, wherein the circuit board retainer further includes:

a leg junction having the first and second deflectable legs commonly extending from the leg junction; and a minimum spacing defined by the tapered slot proximate to the leg junction, the minimum spacing being substantially equal to a thickness of the second circuit board.

9. The imager assembly of claim 1, wherein the circuit board retainer is a polymeric material to permit each of the first and second legs to be molded, the circuit board retainer further including a conical body portion to permit the circuit board retainer to be aligned for insertion into the imager body.

10. An imager assembly for a remote inspection device, comprising:

an imager body remotely positioned from a hand held display device;

a circuit board assembly positioned in the imager body;

a flexible tube having a first end connected to an end of the imager body using a first ferrule;

a male connector connected to a second end of the flexible tube using a second ferrule; and a wiring harness disposed through a bore of the flexible tube and electrically connecting the circuit board assembly to the hand held display device, the wiring harness including:

a plurality of wires joined in a side-by-side configuration; and two individual wires twisted together to define a twisted wire pair, the twisted wire pair including a differential signal wire defining a positive lead and a differential signal wire defining a negative lead.

11. The imager assembly of claim 10, wherein the twisted wire pair has an amount of twist defined as a number of turns of the two wires of the twisted wire pair per a length of the twisted wire pair.

12. The imager assembly of claim 11, wherein the amount of twist of the twisted wire pair is controlled to create a defined impedance and a defined capacitance of the twisted wire pair.

13. The imager assembly of claim 12, wherein the defined impedance is approximately 100 ohms.

14. The imager assembly of claim 13, wherein the defined capacitance is less than 30 pico-farrads per meter of length of the twisted wire pair.

15. The imager assembly of claim 10, wherein the twisted wire pair is joined to the plurality of wires joined in the side-by-side configuration, the plurality of wires joined in the side-by-side configuration including an LED power wire defining a positive lead, an LED power wire defining a negative lead, and at least a ground wire, having the twisted wire pair separated from the LED power wires by the ground wire to minimize interference with signals transferred via the twisted wire pair, the twisted wire pair and the plurality of wires joined in the side-by-side configuration being together twisted to a diameter adapted to slidably fit within the flexible tube.

16. The imager assembly of claim 10, wherein the twisted wire pair is freely disposed with respect to the plurality of wires joined in the side-by-side configuration, the plurality of wires bonded in the side-by-side configuration including each of a power ground wire, a power (+5 volts) wire, a two wire interface (CLK) wire, a two wire interface (DATA) wire, an LED power wire defining a positive lead, and an LED power wire defining a negative lead, the wires joined in the side-by-side configuration being together twisted to a diameter adapted to slidably fit within the flexible tube and the twisted wire pair being disposed within a cavity defined within the twisted plurality of wires.

17. The imager assembly of claim 10, wherein the twisted wire pair is freely disposed with respect to the plurality of wires joined in the side-by-side configuration, the plurality of wires joined in the side-by-side configuration being twisted to a diameter and the twisted wire pair being disposed outside of the twisted wires joined in the side-by-side configuration, the diameter of the twisted wires joined in the side-by-side configuration and the twisted wire pair together adapted to slidably fit within the flexible tube.

18. An imager assembly for a remote inspection device, comprising:
   an imager body remotely positioned from a hand held display device;
   a circuit board assembly positioned in the imager body, the circuit board assembly including an imager device connected to a first circuit board and a second circuit board electrically connected to the first circuit board;
   a flexible tube having a first end connected to an end of the imager body using a first ferrule and a second end connected to the hand held display device; and
   a third circuit board of the circuit board assembly, the first circuit board connected to the second circuit board by a first flexible cable, and the second circuit board connected to the third circuit board by a second flexible cable.

19. The imager assembly of claim 18, wherein each of the first, second, and third circuit boards are oriented substantially parallel to each other, and the first and second flexible cables are each a ribbon cable.

20. The imager assembly of claim 18, wherein each of the second and third circuit boards is oriented substantially parallel to each other and the first circuit board is oriented at an angle with respect to the second and third circuit boards, and the first and second flexible cables are each a ribbon cable.

21. An imager assembly for a remote inspection device, comprising:
   an imager body remotely positioned from a hand held display device;
   an imager device positioned in the imager body;
   a flexible tube having an outer sheathing layer and an inner shielding layer, and a first end connected to an end of the imager body using a first ferrule;
   a male connector connected to a second end of the flexible tube using a second ferrule;
   a wiring harness disposed through a bore of the flexible tube and through both the first and second ferrules and electrically connecting the imager device to the hand held display device, the wiring harness including a plurality of wires adapted to transfer a digital signal representing an image received by the imager device; and
   a sheathing removal area at opposed ends of the flexible tube each having an exposed portion of the shielding layer, each exposed portion further including a flattened area adapted to engage a non-rotational engagement surface of individual ones of the first and second ferrules to minimize rotation of the flexible tube with respect to the imager body and the male connector.

22. The imager assembly of claim 21, wherein the imager device is adapted to produce a digital signal.

23. The imager assembly of claim 22, wherein the wiring harness includes a plurality of wires oriented in a side-by-side configuration and a twisted wire pair joined to the plurality of wires oriented in a side-by-side configuration, the twisted wire pair adapted to transfer the digital signal from the imager device.

24. The imager assembly of claim 23, wherein the hand held display housing includes an image view screen, the hand held display housing adapted to connect to the male connector, the image view screen adapted to display the image created by the digital signal.

25. A remote inspection device, comprising:
   a hand held display housing having an image view screen;
   a male connector connected to the hand held display housing;
   a flexible tube having a first end connected to the male connector using a first ferrule and a second end;
   an imager body, the second end of the flexible tube connected to the imager body using a second ferrule;
   a circuit board assembly positioned in the imager body having an imager device connected to a first circuit board adapted to receive a visual image and convert the visual image to a digital signal and a second circuit board connected to the first circuit board;
   a wiring harness disposed through a bore of the flexible tube and electrically connected to the circuit board assembly and the image view screen, the wiring harness including a plurality of wires joined in a side-by-side configuration and two individual wires twisted together to define a twisted wire pair, the twisted wire pair fixed to the plurality of wires and operable to transfer the digital signal.

26. The remote inspection device of claim 25, wherein the twisted wire pair has an amount of twist defined as a number of turns of the two wires of the twisted wire pair per a length of the twisted wire pair.

27. The remote inspection device of claim 26, wherein the amount of twist of the twisted wire pair is controlled to create a defined impedance and a defined capacitance of the twisted wire pair.

28. The remote inspection device of claim 27, wherein the defined impedance is approximately 100 ohms, and the defined capacitance is less than 30pico-farrads per meter of length of the twisted wire pair.

29. The remote inspection device of claim 25, further including:
   a polymeric material circuit board retainer slidably received through an end of the imager body, the circuit board retainer having deflectable legs separated by a tapered slot having a minimum spacing proximate to a leg junction substantially equal to a thickness of the second circuit board; and
   wherein the second circuit board is received in the tapered slot of the circuit board retainer and frictionally engaged by the deflectable legs when the circuit board retainer is disposed in the imager body.

30. The remote inspection device of claim 25, wherein the circuit board assembly includes:
   a third circuit board connected to the second circuit board;
   wherein the first circuit board is connected to the second circuit board by a first ribbon cable, and the second circuit board is connected to the third circuit board by a second ribbon cable.

31. The remote inspection device of claim 30, wherein the second and third circuit boards are oriented substantially parallel to each other and the first circuit board is oriented at an angle with respect to the second and third circuit boards positioning the imager device at an angle with respect to a longitudinal axis of the imager body.

* * * * *